US012563853B2

(12) United States Patent
Peng et al.

(10) Patent No.: US 12,563,853 B2
(45) Date of Patent: Feb. 24, 2026

(54) BACKSIDE ILLUMINATED CMOS IMAGE SENSOR AND METHOD OF MAKING THE SAME

(71) Applicant: Shanghai Huali Integrated Circuit Corporation, Shanghai (CN)

(72) Inventors: Xiang Peng, Shanghai (CN); Haoyu Chen, Shanghai (CN); Feng Ji, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 408 days.

(21) Appl. No.: 17/899,402

(22) Filed: Aug. 30, 2022

(65) Prior Publication Data

US 2023/0091032 A1      Mar. 23, 2023

(30) Foreign Application Priority Data

Sep. 18, 2021     (CN) .......................... 202111103867.6

(51) Int. Cl.
H10F 39/00 (2025.01)
H10F 39/12 (2025.01)

(52) U.S. Cl.
CPC ......... H10F 39/807 (2025.01); H10F 39/014 (2025.01); H10F 39/199 (2025.01); H10F 39/811 (2025.01)

(58) Field of Classification Search
CPC .......... H01L 27/1463; H01L 27/14636; H01L 27/1464; H01L 27/14683; H01L 27/14689; H10F 39/807; H10F 39/014; H10F 39/199; H10F 39/811; H10F 39/011
See application file for complete search history.

(56) References Cited

U.S. PATENT DOCUMENTS

| | | | |
|---|---|---|---|
| 9,871,070 B2 | 1/2018 | Hsu et al. | |
| 10,319,768 B2 | 6/2019 | Li et al. | |
| 12,040,339 B2 | 7/2024 | Xia et al. | |
| 2016/0099278 A1 | 4/2016 | Guyader et al. | |
| 2017/0271384 A1* | 9/2017 | Zheng ................... | H10F 39/199 |

(Continued)

FOREIGN PATENT DOCUMENTS

| | | |
|---|---|---|
| CN | 107046045 A | 8/2017 |
| CN | 109427832 A | 3/2019 |

(Continued)

OTHER PUBLICATIONS

Jan. 15, 2025—(CN) First Search Report issued by CNIPA—App 2021111038676, partial English translation.

*Primary Examiner* — Marlon T Fletcher
*Assistant Examiner* — Da Wei Lee
(74) *Attorney, Agent, or Firm* — Banner & Witcoff, Ltd.

(57) ABSTRACT

The present application provides a backside illuminated CMOS image sensor and a method of making the same. The backside illuminated CMOS image sensor comprises: a pixel region substrate, an isolation structure, a first dielectric layer, a metal grid, and second dielectric layer, wherein grid trenches and a metal plug are formed in the pixel region substrate, the isolation structure is located in each of the grid trenches and on the surface of the pixel region substrate outside of the grid trenches, and the isolation structure comprises a high-K dielectric layer, an insulating layer, and a metal core layer.

10 Claims, 8 Drawing Sheets

(56) References Cited

U.S. PATENT DOCUMENTS

2018/0331159 A1* 11/2018 Lee ......................... H10K 30/82
2019/0067355 A1    2/2019 Li et al.
2021/0366956 A1* 11/2021 Wu ....................... H10F 39/811
2022/0310678 A1*  9/2022 Li .......................... H10F 39/199

FOREIGN PATENT DOCUMENTS

CN        111863850  A    10/2020
CN        114765194  A     7/2022

* cited by examiner

BACKSIDE ILLUMINATED CMOS IMAGE SENSOR AND METHOD OF MAKING THE SAME

CROSS-REFERENCES TO RELATED APPLICATIONS

This application claims priority to Chinese patent application No. CN 202111103867.6 filed at CNIPA on Sep. 18, 2021, and entitled "BACKSIDE ILLUMINATED CMOS IMAGE SENSOR AND METHOD OF MAKING THE SAME", the disclosure of which is incorporated herein by reference in entirety.

TECHNICAL FIELD

The present application relates to the technical field of semiconductor devices, in particular, to a backside illuminated CMOS image sensor and a method for manufacturing the same.

BACKGROUND OF THE DISCLOSURE

In a backside illuminated CMOS image sensor (BSI CIS), in particular in an ultra-thin stacked CMOS image sensor (UTS CIS), there are problems of electronic crosstalk and optical crosstalk between pixel units. Currently, in order to reduce the electronic and optical crosstalk between pixel arrays, deep trench isolation (DTI) structures can be built on pixel units. Specifically, deep trenches are filled with a high dielectric constant (High K) material to form potential barriers, thereby isolating photo-induced electrons or noise electrons generated between the pixel arrays.

However, as the requirements for pixels of backside illuminated CMOS image sensors in the market become increasingly stringent and the sizes of sensor modules continuously shrink, size of a single pixel unit needs to decrease continuously, the full well capacity (FWC) of a single pixel under the same process also decreases, thus a decrease in the signal-to-noise ratio caused by the electronic crosstalk has becomes increasingly serious. Therefore, the solution of filling deep trenches with a high dielectric constant (High K) material to form isolation potential barriers has been unable to solve the problems of electronic crosstalk and optical crosstalk. As a result, a new design and a new process are badly needed in order to improve the crosstalk resistance and image pixels of the backside illuminated CMOS image sensors.

BRIEF SUMMARY OF THE DISCLOSURE

The present application provides a backside illuminated CMOS image sensor and a method for manufacturing the same, so as to solve the problems of electronic crosstalk and optical crosstalk of the backside illuminated CMOS image sensor.

In an aspect, an embodiment of the present application provides a backside illuminated CMOS image sensor, including:

a pixel region substrate, wherein a grid trenches and a plurality of vias located on the grid trenches side are separately formed in the pixel region substrate, and a metal plug is formed in the via;

an isolation structure, the isolation structure being located in the grid trenches and on the surface of the pixel region substrate between the grid trenches;

a first dielectric layer, the first dielectric layer being located on the isolation structure and the metal plug;

a metal grid, the metal grid being located on the first dielectric layer on the surface of the isolation structure; and a second dielectric layer, the second dielectric layer being located on the metal grid;

wherein the isolation structure includes a high-K dielectric layer, an insulating layer, and a metal core layer, the high-K dielectric layer covers the bottom wall and side walls of the grid trenches and the surface of the pixel region substrate between the grid trenches, the insulating layer covers the high-K dielectric layer, and the metal core layer is located on the insulating layer in the grid trenches.

In an example, the backside illuminated CMOS image sensor further includes a metal interconnection structure, the metal interconnection structure is located on any one of the metal plugs and is connected to any grid point of the metal grid, and the grid point connected to the metal interconnection structure is completely disconnected from the remainder of the metal grid.

In an example, the backside illuminated CMOS image sensor further includes a metal liner layer, the metal liner layer is located between the grid point and the metal core layer, and the metal plug is electrically connected to the metal core layer by means of the metal interconnection structure, the grid point, and the metal liner layer.

In an example, the metal core layer is grid-shaped, and the upper surface of the metal core layer is flush with the upper surface of the insulating layer between the grid trenches.

In an example, the backside illuminated CMOS image sensor further includes a block layer, and the block layer covers the substrate surface around the grid trenches.

In an example, the backside illuminated CMOS image sensor further includes an anti-reflection layer, and the anti-reflection layer is located between the high-K dielectric layer and the insulating layer.

In an example, the backside illuminated CMOS image sensor further includes a logic region substrate, the logic region substrate is located on the surface of the pixel region substrate away from the metal grid, and the via extends from the pixel region substrate into the logic region substrate.

In another aspect, an embodiment of the present application provides a method for manufacturing a backside illuminated CMOS image sensor, including:

forming a pixel region substrate, wherein a grid trenches and a plurality of vias located on the grid trenches side are separately formed in the pixel region substrate, and a metal plug is formed in the via;

forming an isolation structure in the grid trenches and on the surface of the pixel region substrate between the grid trenches;

forming a first dielectric layer on the isolation structure, the metal plug, and the surface of the remaining pixel region substrate;

sequentially forming a metal material layer and a second dielectric layer on the first dielectric layer; and etching the second dielectric layer, the metal material layer, and a partial thickness of the first dielectric layer, so as to form a metal grid on the first dielectric layer on the surface of the isolation structure;

wherein the step of forming the isolation structure includes:

forming a high-K dielectric layer on the bottom wall and side walls of the grid trenches and the surface of the pixel region substrate between the grid trenches;

forming an insulating layer on the high-K dielectric layer;

forming a metal filling layer on the insulating layer; and

etching and removing the metal filling layer between the grid trenches to obtain a metal core layer in the grid trenches.

In an example, in method for manufacturing a backside illuminated CMOS image sensor, during etching of the second dielectric layer, the metal material layer, and a partial thickness of the first dielectric layer for the formation of the metal grid, a metal interconnection structure is formed on any one of the metal plugs by etching the second dielectric layer, the metal material layer, and a partial thickness of the first dielectric layer, the metal interconnection structure is connected to any grid point of the metal grid, and the grid point connected to the metal interconnection structure is completely disconnected from the remainder of the metal grid.

In an example, in method for manufacturing a backside illuminated CMOS image sensor, during etching and removal of the metal filling layer between the grid trenches for obtaining the metal core layer in the grid trenches, a portion of the metal filling layer between the grid trenches or at the edge of the grid trenches is retained to form a metal liner layer, and the metal plug is electrically connected to the metal core layer by means of the metal interconnection structure, the grid point, and the metal liner layer.

The technical solutions of the present application include at least the following advantages:

In the present application, the isolation structure is formed in the grid trenches and on the surface of the pixel region substrate between the grid trenches, the isolation structure includes the high-K dielectric layer, the insulating layer, and the metal core layer, and the metal core layer is connected to the metal plug in the via. In the present application, a negative bias voltage is applied to the metal core layer to isolate photo-induced electrons and/or noise electrons in each region of the pixel region substrate between the grid trenches, avoiding crosstalk of the photo-induced electrons and/or noise electrons in each region of the pixel region substrate, and thereby improving the crosstalk resistance of the backside illuminated CMOS image sensor, improving the imaging color saturation of the CMOS image sensor, improving the image pixel, and improving the image quality.

BRIEF DESCRIPTION OF SEVERAL VIEWS OF THE DRAWINGS

In order to more clearly explain the specific implementations of the present application or the technical solution in the current techniques, the drawings required in description of the specific implementations or the existing arts will be briefly described below. It is obvious that the drawings described below are some implementations of the present application, and those skilled in the art could also obtain other drawings on the basis of these drawings, without involving any inventive skills.

DESCRIPTION OF REFERENCE NUMERALS

Figure 1:
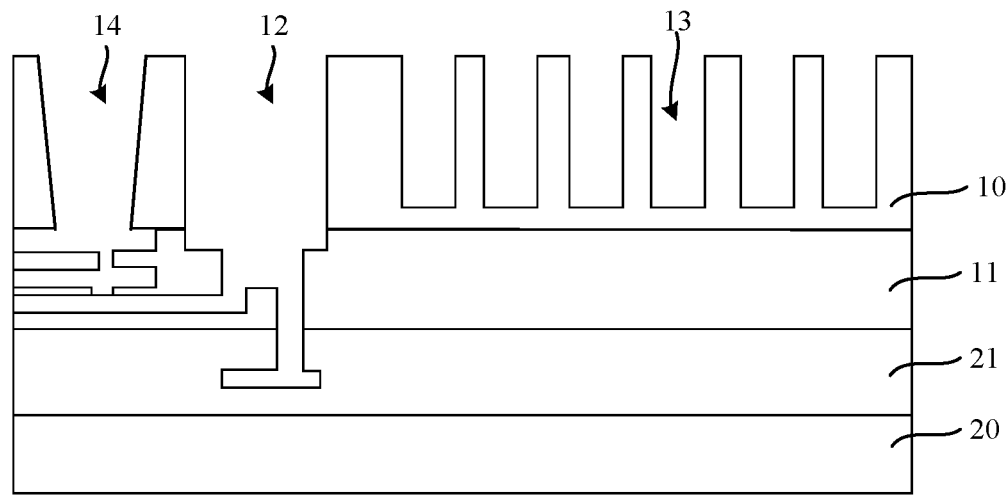
FIGS. 1-9 are schematic structural diagrams of major process steps during manufacturing the semiconductor backside illuminated CMOS image sensors according to an embodiment of the present application.

10—pixel region substrate, 11—first bonding layer, 12—via, 121—metal plug, 122—first lead—out pad, 13—grid trenches, 14—first opening, 15—isolation structure, 151—high—K dielectric layer, 152—insulation layer, 153—metal filling layer, 154—metal core layer, 155—metal liner layer, 16—block layer, 17—first dielectric layer, 171—second opening, 172—third opening, 173—fourth opening, 18—metal material layer, 181—metal grid, 1811—any point of the metal grid, 1812—remainder of the metal grid, 182—metal interconnection structure, 183—second lead—out pad, 19—second dielectric layer; 20—logic region substrate, and 21—second bonding layer.

DETAILED DESCRIPTION OF THE DISCLOSURE

The present invention will be clearly and completely described below with reference to the drawings. Obviously, the described embodiments are part of the present application, rather than all of them. Based on the present disclosure, all other embodiments obtained by those skilled in the art without involving any inventive efforts shall fall into the protective scope of the present application.

In the description of the present application, it should be noted that the orientation or position relationship indicated by the terms "center", "upper", "lower", "left", "right", "vertical", "horizontal", "inner", "outer", etc. is based on the orientation or position relationship shown in the drawings, intended only for the convenience of describing the present application and simplifying the description, rather than indicating or implying that the apparatus or element referred to necessarily has a specific orientation or is configured or operated in a specific orientation, and thus cannot be construed as a limitation on the present application. In addition, the terms "first", "second", and "third" are used for descriptive purposes only, and cannot be construed as indicating or implying relative importance.

In the description of the present application, it should be noted that, unless otherwise clearly specified and limited, the terms "mounting", "coupling", and "connecting" should be understood in a broad sense, for example, it can be a fixed connection, a detachable connection, or an integrated connection, can be a mechanical connection or an electrical connection, can be a direct connection, an indirect connection implemented by means of an intermedium, or an internal connection between two components, and can be a wireless connection or a wired connection. Those skilled in the art could understand the specific meanings of the above terms in the present application on the basis of specific situations.

In addition, the technical features involved in different embodiments of the present application described below can be combined with each other in the case of no conflict.

An embodiment of the present application provides a method for manufacturing a backside illuminated CMOS image sensor. The method for manufacturing the backside illuminated CMOS image sensor mainly includes the following steps:

Step 1: forming a pixel region substrate, forming separately a grid trenches and a plurality of vias on a side of the grid trenches in the pixel region substrate, and forming a metal plug in each of the vias.

Step 2: forming an isolation structure in the grid trenches and on the surface of the pixel region substrate between the grid trenches.

Step 3: forming a first dielectric layer on the isolation structure, the metal plug, and the surface of the remaining pixel region substrate.

Step 4: forming a metal material layer and a second dielectric layer sequentially on the first dielectric layer.

Step 5: etching the metal material layer to form a metal grid on the first dielectric layer on the surface of the isolation structure.

Specifically, referring to FIGS. 1-9, FIGS. 1-9 are schematic structural diagrams at major process steps during manufacturing the semiconductor backside illuminated CMOS image sensors according to the embodiment of the present application.

First, referring to FIG. 1, the pixel region substrate 10 is provided, wherein the grid trenches 13, the via 12 and the first openings 14 located on the side of grid trenches 13 are separately formed in the pixel region substrate 10. Specifically, before the grid trenches 13 and the via 12 are formed by etching the pixel region substrate 10, the method further includes the following steps: a first bonding layer 11 is formed on the pixel region substrate 10; a logic region substrate 20 is provided, and a second bonding layer 21 is formed on the logic region substrate 20; using the first bonding layer 11 and the second bonding layer 21, the pixel region substrate 10 and the logic region substrate 20 are bonded together by means of a Van Der Waals force bonding process; and the surface of the pixel region substrate 10 away from the first bonding layer 11 is thinned.

In this embodiment, subsequent processes on the pixel region substrate 10 are all performed on the thinned surface of the pixel region substrate 10 away from the first bonding layer 11. The pixel region substrate 10 may be made of one of monocrystalline silicon, polycrystalline silicon, and amorphous silicon, and the pixel region substrate 10 may also be made of gallium arsenide, a silicon gallium compound, etc. The pixel region substrate 10 may have a silicon-on-insulator layer or an epitaxial layer-on-silicon structure. The pixel region substrate 10 may also be made of other semiconductor materials, which are not listed herein. Specifically, the grid trenches 13 may be construed as being formed by vertically arranging a plurality of first deep trenches and a plurality of second deep trenches. The first opening 14 is used for the subsequent formation of a first lead-out pad 122. Specifically, the via 12 is a through-silicon-via (TSV), and the pixel region substrate 10, the first bonding layer 11, and the second bonding layer 22 are etched to form the via 12, so that the via 12 extends from the pixel region substrate 10 into the logic region substrate 20. Subsequently, the via 12 is filled with a metal material to form the metal plug 121, and the metal plug 121 is used to connect respective metal layers in the pixel region substrate 10 and the logic region substrate 20.

Figure 2:
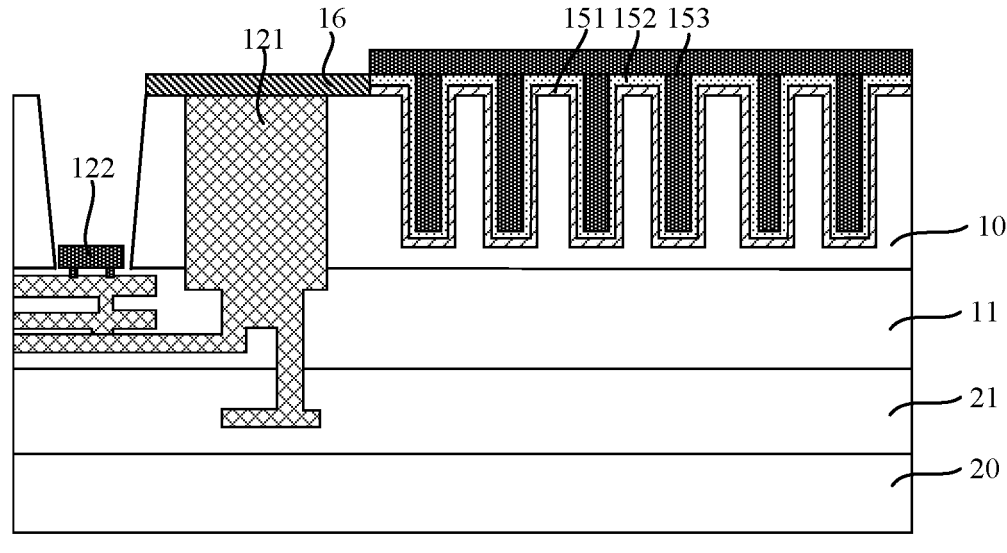
Figure 3:
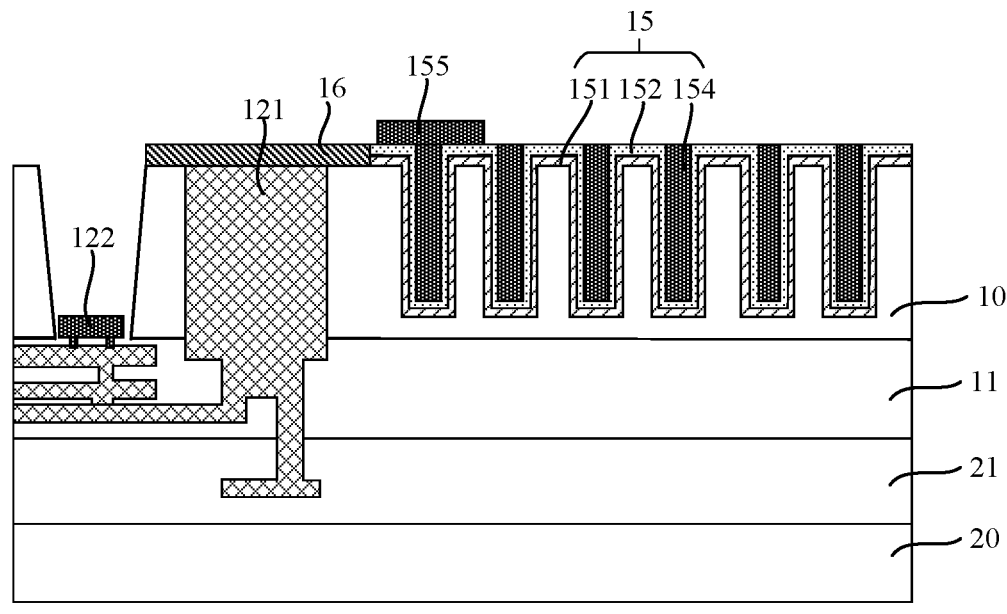

Next, referring to FIG. 2 and FIG. 3, the isolation structure 15 is formed in the grid trenches 13 and on the surface of the pixel region substrate 10 between the grid trenches 13. Specifically, the formation of the isolation structure 15 mainly includes the following four steps:

1) A high-K dielectric layer 151 is formed on the bottom wall and side walls of the grid trenches 13 and the surface of the pixel region substrate 10 between the grid trenches 13.

2) An insulating layer 152 is formed on the high-K dielectric layer 151.

3) A metal filling layer 153 is formed on the insulating layer 152.

4) The metal filling layer 153 between the grid trenches 13 is etched and removed to obtain a metal core layer 154 in the grid trenches 13.

Figure 4:
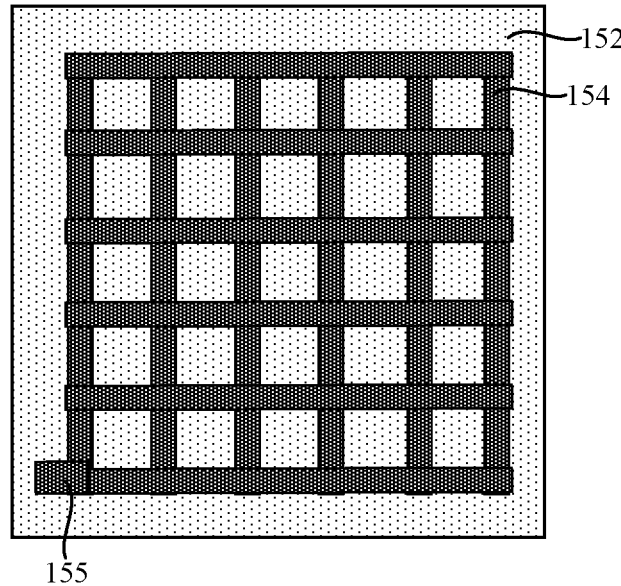

Referring to FIG. 4, FIG. 4 is a top view of the isolation structure 15, and the metal core layer 154 is grid-shaped. The formation of the metal core layer 154 also includes etching back a partial thickness of the metal filling layer 153 on the grid trenches 13. In the present application, it is necessary to ensure that the upper surface of the metal core layer 154 is flush with the upper surface of the insulating layer 152 between the grid trenches 130. The width of the metal filling layer 153 may be in the range of 100-2000 angstroms. The metal filling layer 153 may be made of a metal material such as aluminum or tungsten. The insulating layer 152 may be made of silicon dioxide. The thickness of the high-K dielectric layer 151 and the thickness of the insulating layer 152 are configured according to specific actual situations, and the present application does not limit the thickness of the high-K dielectric layer 151 and the thickness of the insulating layer 152. In the present application, the high-K dielectric layer 151, the insulating layer 152, and the isolation structure 15 of the metal core layer 154 are formed in the grid trenches 13 and on the surface of the pixel region substrate 10 between the grid trenches 13. Subsequently, a negative bias voltage is applied to the metal core layer 154 to isolate photo-induced electrons and/or noise electrons in each region (each pixel unit) of the pixel region substrate between the grid trenches 13 by means of the metal core layer 154, avoiding crosstalk of the photon-induced electrons and/or noise electrons from each pixel unit, and thereby improving the crosstalk resistance of the backside illuminated CMOS image sensors.

In some examples, after the high-K dielectric layer 151 is formed and before the insulating layer 152 is formed, the method further includes a step (not shown) of depositing an anti-reflection layer on the high-K dielectric layer 151, wherein the anti-reflection layer covers the high-K dielectric layer 151.

Specifically, referring to FIG. 3, during etching and removal of the metal filling layer 153 between the grid trenches 13 for obtaining the metal core layer 154 in the grid trenches 13, a portion of the metal filling layer 153 between the grid trenches 13 or at the edge of the grid trenches 13 is retained to form a metal liner layer 155. It can be seen from FIG. 4 that the metal liner layer 155 is connected to the metal core layer 154.

In some examples, in the process of forming the isolation structure 15, the via 12 is correspondingly filled with a metal material such as aluminum or tungsten, so that the metal plug 121 is formed in the via 12. A block layer 16 is formed on the via 12, and the block layer 16 may be made of silicon nitride. In the process of forming the isolation structure 15, the metal filling layer 153 is correspondingly deposited in the first opening 14, and the first lead-out pad 122 is formed by means of an etch-back process, and the first lead-out pad 122 is used for a subsequent packag to connect to an external circuit.

Figure 5:
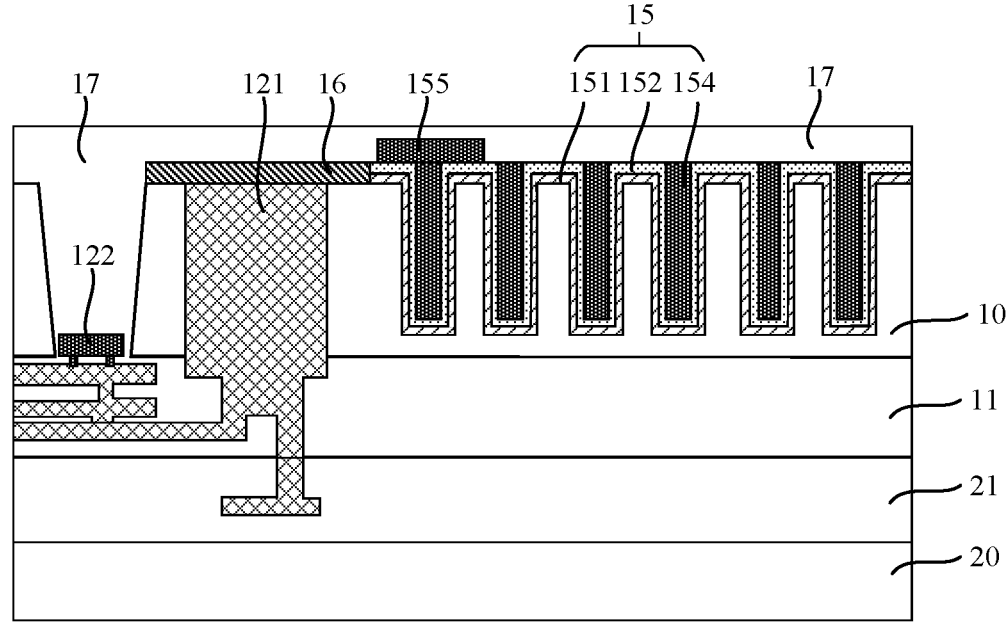

Then, referring to FIG. 5, the first dielectric layer 17 is formed on the isolation structure 15, the metal plug 121, and the surface of the remaining pixel region substrate 10. Specifically, the first dielectric layer 17 may be made of silicon dioxide. In this embodiment, the first dielectric layer 17 may be grown by means of a CVD process, and the thickness of the first dielectric layer 17 may be 0.5-2 μm. Referring to FIG. 5, the first dielectric layer 17 covers the insulating layer 152, the metal core layer 154, and the block layer 16, and fills the first opening 14 (i.e., covers the first lead-out pad 122).

Figure 6:
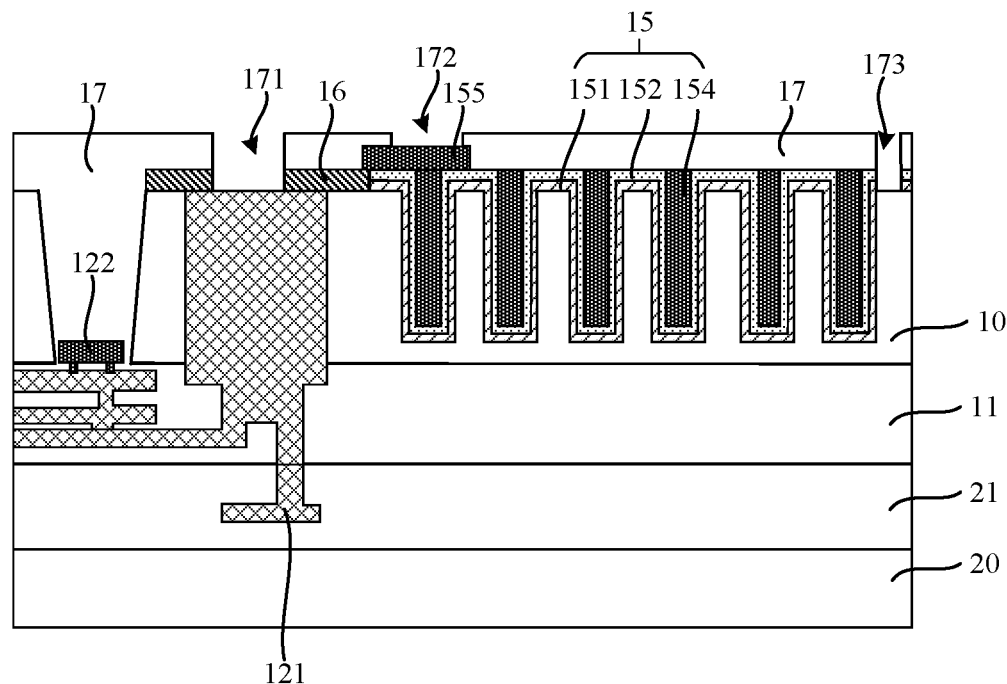

Specifically, referring to FIG. 6, after the first dielectric layer 17 is formed, the following photolithography and etching processes are required in this embodiment: etching the first dielectric layer 17 and the block layer 16 to form a second opening 171 on the metal plug 121; etching the first dielectric layer 17 to form a third opening 172 on the metal liner layer 155; and etching the first dielectric layer 17, the insulating layer 152, and the high-K dielectric layer 151 to form a fourth opening 173 on the surface of the pixel region substrate 10 around the isolation structure 15. In the above processes of forming different openings, the etching of the first dielectric layer 17 may be implemented in a single etching process.

Figure 7:
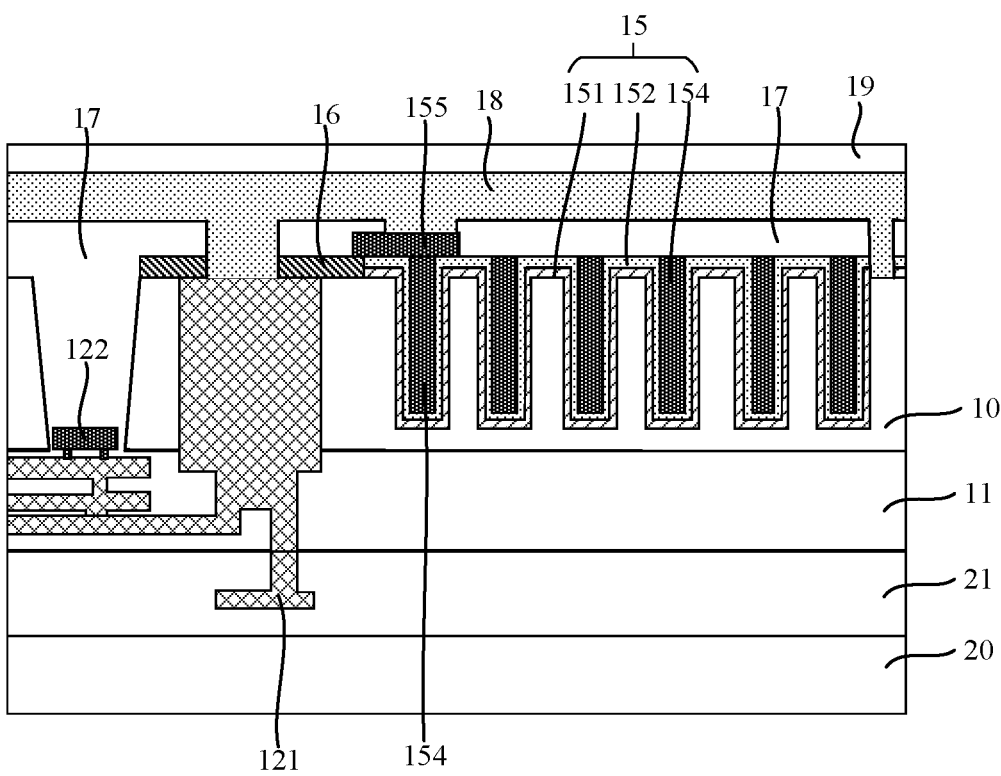

Specifically, referring to FIG. 7, the metal material layer 18 and the second dielectric layer 19 are sequentially formed on the first dielectric layer 17. The metal material layer 18 fills the second opening 171, the third opening 172, and the fourth opening 173, and covers the first dielectric layer 17. The metal material layer 18 may be made of metal such as aluminum or tungsten, and the second dielectric layer 19 may be made of silicon dioxide. The thickness of the metal material layer 18 may be in the range of 0.5-1.0 μm. The thickness of the second dielectric layer 19 may be in the range of 1.0-2.0 μm. Filling the fourth opening 173 with the metal material layer 18/depositing the metal material layer 18 in the fourth opening 173 is intended for the subsequent formation of a second lead-out pad 183, and the second lead-out pad 183 is a grounding (BSGND) structure.

Figure 8:
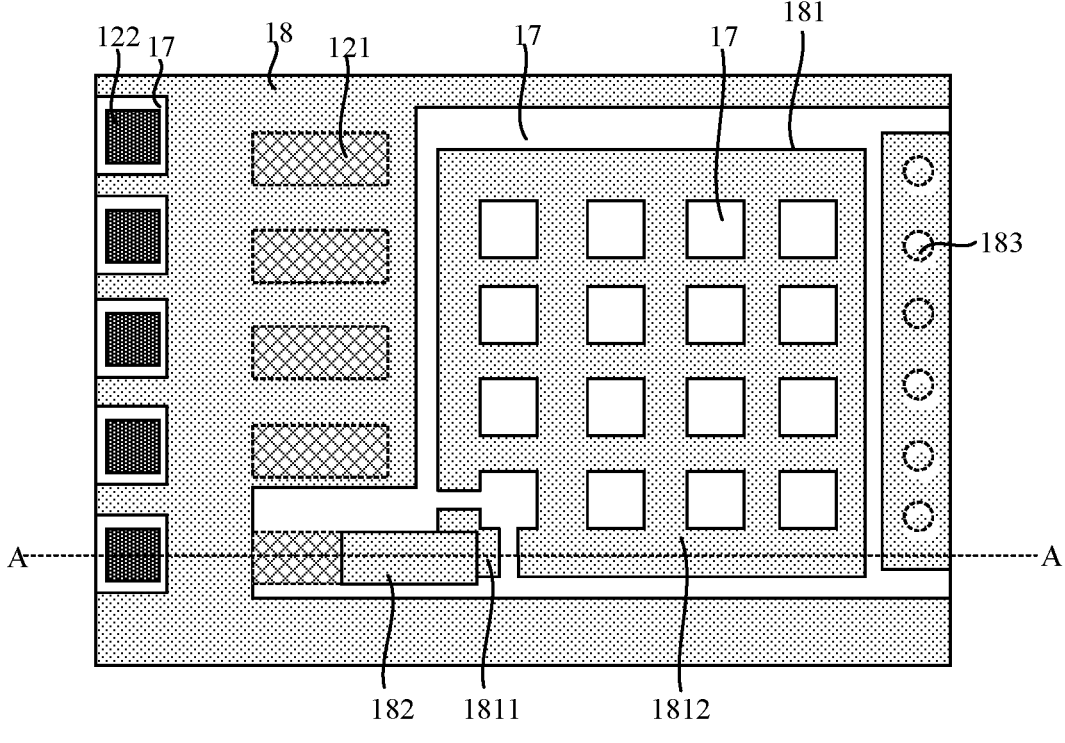
Figure 9:
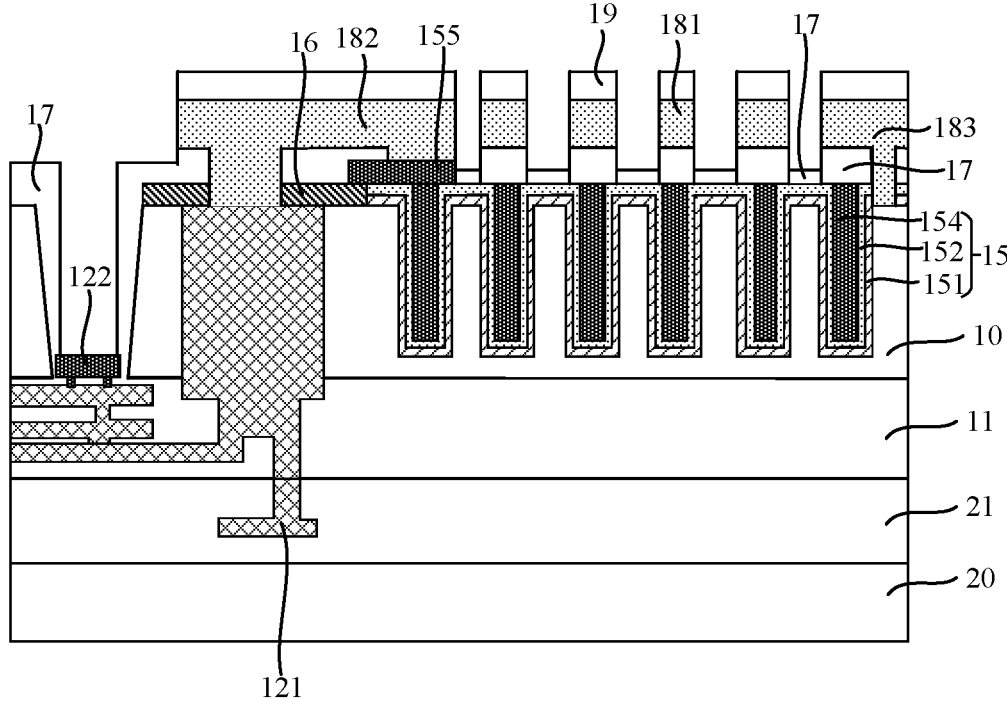

Finally, referring to FIG. 8 and FIG. 9, FIG. 8 is a top view of the backside illuminated CMOS image sensor, and FIG. 9 is a cross sectional view of backside illuminated CMOS image sensor cut along the plane AA in FIG. 8. The second dielectric layer 19, the metal material layer 18, and a partial thickness of the first dielectric layer 17 are etched to form the metal grid 181 on the first dielectric layer 17 on the surface of the isolation structure 15. Specifically, referring to FIG. 8, during etching of the second dielectric layer 19 between the grid trenches 13, the metal material layer 18, and the partial thickness of the first dielectric layer 17 for the formation of the metal grid 181, the metal material layer 18 is etched so that any grid point 1811 of the metal grid is completely disconnected from the remainder 1812 of the metal grid, and the metal material layer 18 is etched to form a metal interconnection structure 182 on the surface of any one of the metal plugs 121. This embodiment takes the grid point 1811 at the vertex position of the metal grid 18 and the first metal plug 121 in a row of metal plugs 121 as examples. The metal interconnection structure 182 on the first metal plug 121 is connected to the grid point 1811 at the vertex position of the metal grid 18. Since the grid point 1811 connected to the metal interconnection structure 182 is completely disconnected from the remainder 1812 of the metal grid, the metal interconnection structure 182 is completely disconnected from the remainder 1812 of the metal grid, that is, there is no electrical connection. The metal plug 121 is electrically connected to the grid-shaped metal core layer 154 by means of the metal interconnection structure 182, the grid point 1811, and the metal liner layer 155. The second lead-out pad 183 formed in the fourth opening 173 is electrically connected to the metal grid 181, and the second lead-out pad 183 (grounding structure) is used for grounding of the metal grid 181 during the operation of the device.

In the present application, the high-K dielectric layer 151, the insulating layer 152, and the isolation structure 15 of the metal core layer 154 are formed in the grid trenches 13 and on the surface of the pixel region substrate 10 between the grid trenches 13. The metal core layer 154 is electrically connected to the metal plug 121. A negative bias voltage is applied to the metal interconnection structure 182, that is, a negative bias voltage is applied to the metal core layer 154 in the isolation structure 15, so as to isolate photo-induced electrons and/or noise electrons in each region (each pixel unit) of the pixel region substrate 10 between the grid trenches 13 by means of the metal core layer 154, avoiding crosstalk of the photo-induced electrons and/or noise electrons in each pixel unit, and thereby improving the crosstalk resistance of the backside illuminated CMOS image sensor, improving the imaging color saturation of the CMOS image sensor, improving the image pixel, and improving the image quality.

Specifically, in the process of etching and removing the second dielectric layer 19 between the grid trenches 13, the metal material layer 18, and the partial thickness of the first dielectric layer 17 to form the metal grid 181, an etch-back process may be performed on the first dielectric layer 17 to expose the first lead-out pad 122.

Based on the same inventive concept, an embodiment of the present application also provides a backside illuminated CMOS image sensor. Referring to FIG. 9, the backside illuminated image CMOS sensor includes the following:

a pixel region substrate 10, wherein grid trenches 13 and via 12 located on one side of the grid trenches 13 are separately formed in the pixel region substrate 10, and a metal plug 121 is formed in the via 12;

an isolation structure 15, the isolation structure 15 being located in the grid trenches 13 and on the surface of the pixel region substrate 10 between the grid trenches 13;

a first dielectric layer 17, the first dielectric layer 17 being located on the isolation structure 15 and the metal plug 121;

a metal grid 181, the metal grid 181 being located on the first dielectric layer 17 on the surface of the isolation structure 15; and a second dielectric layer 19, the second dielectric layer 19 being located on the metal grid 181.

Specifically, the isolation structure 15 includes a high-K dielectric layer 151, an insulating layer 152, and a metal core layer 154. The high-K dielectric layer 151 covers the bottom wall and side walls of the grid trenches 13 and the surface of the pixel region substrate 10 between the grid trenches 13. The insulating layer 152 covers the high-K dielectric layer 151, and the metal core layer 154 is located on the insulating layer 152 in the grid trenches 13.

In some examples, the backside illuminated CMOS image sensor further includes a block layer 16, and the block layer 16 covers the substrate surface around the grid trenches 13, including the surface of the metal plug 121.

In this embodiment, the backside illuminated CMOS image sensor further includes a logic region substrate 20, the logic region substrate 20 is located on the surface of the pixel region substrate 10 away from the metal grid 181, and the via 12 extends from the pixel region substrate 10 into the logic region substrate 20.

In some examples, the backside illuminated CMOS image sensor further includes a metal interconnection structure, 182 the metal interconnection structure 182 is located on any one of the metal plugs and is connected to any grid point 1811 (see FIG. 8) of the metal grid, and the grid point 1811 connected to the metal interconnection structure 182 is completely disconnected from the remainder 1812 of the metal grid.

The backside illuminated CMOS image sensor further includes a metal liner layer 155, the metal liner layer 155 is located between any grid point 1811 of the metal grid and the metal core layer 155, and a specified metal plug 121 in the metal interconnection structure 182 is electrically connected to the metal core layer 154 by means of the metal interconnection structure 182, the grid point 1811, and the metal liner layer 155.

Obviously, the above embodiments are merely examples used for clear description, rather than for limitation on the implementations. Those skilled in the art could also make other changes or modifications in different forms on the basis of the above description. There is no need or way to exhaustively list all of the implementations herein, but obvious changes or modifications derived herefrom still fall within the protection scope created by the present application.

What is claimed is:

1. A backside illuminated CMOS image sensor, comprising:

a pixel region substrate, comprising a plurality of grid trenches, wherein a via is disposed on one side of the plurality of grid trenches on the pixel region substrate, and wherein a metal plug is disposed in the via;

an isolation structure, wherein the isolation structure is disposed in each of the plurality of grid trenches and also on a surface of the pixel region substrate outside of the plurality of grid trenches;

a first dielectric layer, wherein the first dielectric layer is disposed on the isolation structure and the metal plug;

a metal material layer, wherein the metal material layer comprises a metal grid and a metal interconnection structure disposed at a same level, wherein the metal grid is disposed on a surface of the isolation structure on the first dielectric layer, wherein the metal grid comprises grid points disconnected from each other by an etching process, wherein the metal interconnection structure is disposed on the metal plug, and wherein the metal interconnection structure is connected to one grid point of the grid points at a vertex position through a metal liner layer, so that the one grid point is electrically connected to the metal plug through the metal interconnection structure and the metal liner layer, and wherein the metal plug and the one grid point are disconnected from other grid points; and a second dielectric layer, wherein the second dielectric layer is disposed on the metal grid and the metal interconnection structure, wherein the isolation structure further comprises a high-K dielectric layer, an insulating layer, and a metal core layer, wherein the high-K dielectric layer is disposed on a bottom wall and side walls of each of the plurality of grid trenches, and on the surface of the pixel region substrate outside of the plurality of grid trenches, wherein the insulating layer is disposed on the high-K dielectric layer, and wherein the metal core layer is disposed on the insulating layer in the plurality of grid trenches.

2. The backside illuminated CMOS image sensor according to claim 1, wherein the one grid point connected to the metal interconnection structure is completely disconnected from a remainder of the metal grid.

3. The backside illuminated CMOS image sensor according to claim 2, wherein the metal liner layer is disposed between the one grid point and the metal core layer, and wherein the metal plug is electrically connected to the metal core layer by means of the metal interconnection structure and the metal liner layer.

4. The backside illuminated CMOS image sensor according to claim 1, wherein the metal core layer is grid-shaped, and wherein an upper surface of the metal core layer is flush with an upper surface of the insulating layer between an adjacent two of the plurality of grid trenches.

5. The backside illuminated CMOS image sensor according to claim 1, further comprising a block layer, wherein the block layer is disposed on the substrate surface around the plurality of grid trenches.

6. The backside illuminated CMOS image sensor according to claim 1, further comprising an anti-reflection layer, wherein the anti-reflection layer is disposed between the high- K dielectric layer and the insulating layer.

7. The backside illuminated CMOS image sensor according to claim 1, further comprising a logic region substrate, wherein the logic region substrate is located on the surface of the pixel region substrate away from the metal grid, and wherein the via extends from the pixel region substrate into the logic region substrate.

8. A method for manufacturing a backside illuminated CMOS image sensor, comprising:

forming a pixel region substrate, forming a plurality of grid trenches and a via separately at a side of the plurality of grid trenches in the pixel region substrate, and forming a metal plug in the via;

forming an isolation structure in each of the plurality of grid trenches and on a surface of the pixel region substrate outside of the plurality of grid trenches;

forming a first dielectric layer on the isolation structure, on the metal plug, and on the surface of remaining pixel region substrate;

forming a metal material layer on the first dielectric layer and the metal plug;

forming a second dielectric layer on the metal material layer; and etching the second dielectric layer, the metal material layer, and a partial thickness of the first dielectric layer, so as to form a metal grid and a metal interconnection structure disposed at a same level, wherein the metal grid is disposed on the first dielectric layer on the surface of the isolation structure, wherein the metal grid comprises grid points disconnected from each other by the etching, wherein the metal interconnection structure is disposed on the metal plug, and wherein the metal interconnection structure is connected to one grid point of the grid points of the metal grid at a vertex position through a metal liner, so that the metal plug is electrically connected to the one grid point, wherein the metal plug and the one grid point are disconnected from other grid points, wherein the step of forming the isolation structure comprises:

forming a high-K dielectric layer on a bottom wall and side walls of the plurality of grid trenches and on the surface of the pixel region substrate between the grid trenches;

forming an insulating layer on the high-K dielectric layer;

forming a metal filling layer on the insulating layer; and etching and removing the metal filling layer between the plurality of grid trenches to obtain a metal core layer in the plurality of grid trenches.

9. The method for manufacturing the backside illuminated CMOS image sensor according to claim 8, wherein the one grid point connected to the metal plug is completely disconnected from other grid points of the metal grid.

10. The method for manufacturing the backside illuminated CMOS image sensor according to claim 9, wherein, during the etching and the removing the metal filling layer between the plurality of grid trenches to obtain the metal core layer, a portion of the metal filling layer is retained between the plurality of grid trenches or at an edge of the plurality of grid trenches to form a metal liner layer, and wherein the metal plug is electrically connected to the metal core layer by means of the metal interconnection structure, the one grid point, and the metal liner layer.

* * * * *